United States Patent
Srinivas et al.

(10) Patent No.: US 6,524,952 B1
(45) Date of Patent: Feb. 25, 2003

(54) METHOD OF FORMING A TITANIUM SILICIDE LAYER ON A SUBSTRATE

(75) Inventors: Ramanujapuram A. Srinivas, San Jose, CA (US); Brian Metzger, San Jose, CA (US); Shulin Wang, Campbell, CA (US); Frederick C. Wu, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 09/597,434

(22) Filed: Jun. 20, 2000

Related U.S. Application Data
(60) Provisional application No. 60/141,082, filed on Jun. 25, 1999.

(51) Int. Cl.$^7$ ............................................. H01L 21/4763
(52) U.S. Cl. ................. 438/649; 438/682; 438/597; 438/602; 438/625; 438/627; 438/630; 438/683; 438/685; 438/906; 438/909
(58) Field of Search .................. 438/682, 597, 438/584, 602, 618, 625, 627, 630, 637, 642, 643, 648, 649, 683, 685, 906, 909

(56) References Cited

U.S. PATENT DOCUMENTS

| | | | |
|---|---|---|---|
| 5,240,739 A | 8/1993 | Doan et al. | 427/126.1 |
| 5,320,880 A | 6/1994 | Sandhu et al. | 427/578 |
| 5,344,792 A | 9/1994 | Sandhu et al. | 437/200 |
| 5,376,405 A | 12/1994 | Doan et al. | 427/126.1 |
| 5,378,660 A | 1/1995 | Ngan et al. | 437/247 |
| 5,416,045 A * | 5/1995 | Kauffman et al. | 438/660 |
| 5,652,181 A | 7/1997 | Thakur | 437/192 |
| 5,885,896 A | 3/1999 | Thakur et al. | 438/649 |
| 5,916,365 A * | 6/1999 | Sherman | 117/92 |
| 5,960,303 A | 9/1999 | Hill | 438/592 |
| 5,972,785 A | 10/1999 | Shishiguchi et al. | 438/592 |
| 5,998,871 A | 12/1999 | Urabe | 257/754 |
| 6,071,552 A | 6/2000 | Ku | 427/99 |
| 6,132,514 A * | 10/2000 | Srinivasan et al. | 118/715 |
| 6,174,805 B1 * | 1/2001 | Urabe | 438/648 |

FOREIGN PATENT DOCUMENTS

| | | | | |
|---|---|---|---|---|
| JP | HEI 10-209278 | 8/1998 | | H01L/21/768 |
| WO | 96/42105 | 12/1996 | | H01L/21/285 |

OTHER PUBLICATIONS

Mori et al. "Contact Plug Formed with Chemical–Vapour–Deposited TiN" Extended Abstracts of the 1991 International Conference on Solid States Devices and Materials, Yokohama, 1991, pp. 210–212.
Gross et al. "Effect of $NH_3$ Plasma Treatment on Etching of Ti During $TiCl_4$–Based TiN CVD Processor" Mat. Res. Soc. Symp. PRoc. vol. 514, pp. 523–529, 1998.
Wolf, Stanley "Silicon Processing for VLSI Era" vol. 2, Process Integration, pp. 162–169, 1990.
Wolf et al. "Silicon Processing for VLSI Era" vol. 1, Process Technology, pp. 398–405, 1986.
Ritala et al. "Perfectly Conformal TiN and $Al_2O_3$ Films Deposited by Atomic Layer Deposition" Communications, Chem. Vap. Deposition, No. 1, pp. 7–9, 1999.

* cited by examiner

*Primary Examiner*—Wael Fahmy
*Assistant Examiner*—Julio J. Maldonado
(74) *Attorney, Agent, or Firm*—Moser, Patterson, Sheridan LLP.

(57) ABSTRACT

A method of forming a silicide layer in contact with a silicon substrate. The method comprises forming the silicide layer by supplying a silicon-containing source that is different from the silicon substrate, such that the silicon in the silicide layer originates primarily from the silicon-containing source.

15 Claims, 6 Drawing Sheets

METHOD OF FORMING A TITANIUM SILICIDE LAYER ON A SUBSTRATE

CROSS REFERENCE TO RELATED APPLICATIONS

This application claims priority to commonly-assigned U.S. provisional patent application Ser. No. 60/141,082, entitled "Method of Titanium Silicide Film Formation in a Semiconductor Device," filed on Jun. 25, 1999, which is herein incorporated by reference.

BACKGROUND OF THE DISCLOSURE

1. Field of the Invention

The invention relates to a method of forming silicide in semiconductor devices and, more particularly, to a method of forming a silicide layer in contact with a silicon substrate.

2. Description of the Background Art

In the manufacture of integrated circuits, intermediate or transition layers are often used as a metal barrier layer to inhibit the diffusion of metals into an underlying region beneath the barrier layer and/or to enhance adhesion of subsequently formed layers. These underlying regions include transistor gates, capacitor dielectric, semiconductor substrates, metal lines, and many other structures that appear in integrated circuits.

For example, when an electrode is formed from a transistor's gate, a diffusion barrier is often used between the gate material and a metal layer that contacts the gate electrode. The diffusion barrier inhibits metal diffusion into the gate material, which may be composed of polysilicon. Such metal diffusion is undesirable because it would change the characteristics of the transistor, or render it inoperative. A combination of titanium/titanium nitride (Ti/TiN), for example, is often used as an adhesion/diffusion barrier.

Such a barrier stack is also used in a tungsten (W) metallization process to provide contacts to source and drain regions of the transistor. The barrier stack prevents undesirable metal diffusion between the tungsten plug and the underlying silicon (Si) substrate. For example, a Ti layer is typically deposited upon the contact regions of a Si substrate, followed by conversion of the Ti layer into an intermediate titanium silicide (TiSi$_x$) layer, which provides a lower resistance contact with Si. If the Ti deposition is performed using plasma enhanced chemical vapor deposition (PECVD), e.g., at a temperature between 550–700° C., a reaction will occur between the Ti film and the underlying silicon substrate at the bottom of the contact. This leads to the formation of a titanium silicide (TiSi$_x$) layer upon the silicon substrate. Alternatively, if the Ti film is deposited using physical vapor deposition (PVD), then the TiSi$_x$ layer at the bottom of the contact may be formed in a separate rapid thermal process (RTP) step, either prior to or during subsequent film processing. A TiN layer is then formed upon the TiSi$_x$ layer, followed by the formation of a tungsten (W) plug. In addition to being a barrier layer, the TiN layer serves two functions: 1) prevents chemical attack of TiSi$_x$ by tungsten hexafluoride (WF$_6$) during W deposition; and 2) acts as a glue layer to promote adhesion of the W plug.

Presently, integrated circuit devices have feature sizes in the range of about 0.25 micron ($\mu$m). As future generations of semiconductor devices approach the sub-0.25 $\mu$m and sub-0.18 $\mu$m regimes, devices will have relatively shallower junctions or trenches on the same substrate. Typically, formation of the intermediate TiSi$_x$ layer requires sacrificing a portion of the Si substrate as a Si source. With decreasing thickness of available Si, such Si consumption will lead to deterioration of the electrical characteristics of the substrate and devices formed thereon will result in a failed or substandard end product.

Therefore, a need exists in the art for an alternate method of forming silicide layers without compromising substrate quality or device characteristics.

SUMMARY OF THE INVENTION

The invention provides a method for forming a silicide layer in contact with a silicon substrate. The method comprises forming a metal-containing layer upon a Si substrate, exposing the metal-containing layer to a silicon-containing source that is different from the silicon substrate. The metal-containing layer reacts with the silicon-containing source and results in the formation of a metal silicide layer having silicon originating primarily from the silicon-containing source.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention generally provides a method of forming a silicided contact with improved device reliability. According to the present invention, a layer comprising silicon (Si), which may be an intermediate layer in a multi-layer metallization structure, is formed upon a silicon-containing layer or substrate without consuming silicon (Si) from the underlying layer. In particular, the method comprises forming a silicided layer, e.g., comprising Si and a refractory metal, upon a substrate interface using an alternate Si-based source other than the underlying silicon-containing layer or substrate. In one embodiment, titanium silicide (TiSi$_x$) is formed on a silicon substrate. In contrast with conventional techniques for silicide formation, the invention allows the formation of TiSi$_x$ without depleting a substantial amount of Si from the substrate. The present invention is applicable to silicide formation during various stages of integrated circuit fabrication—e.g., contact formation to a source or drain of a transistor, or to a polysilicon gate electrode.

Wafer Processing System

Figure 1:
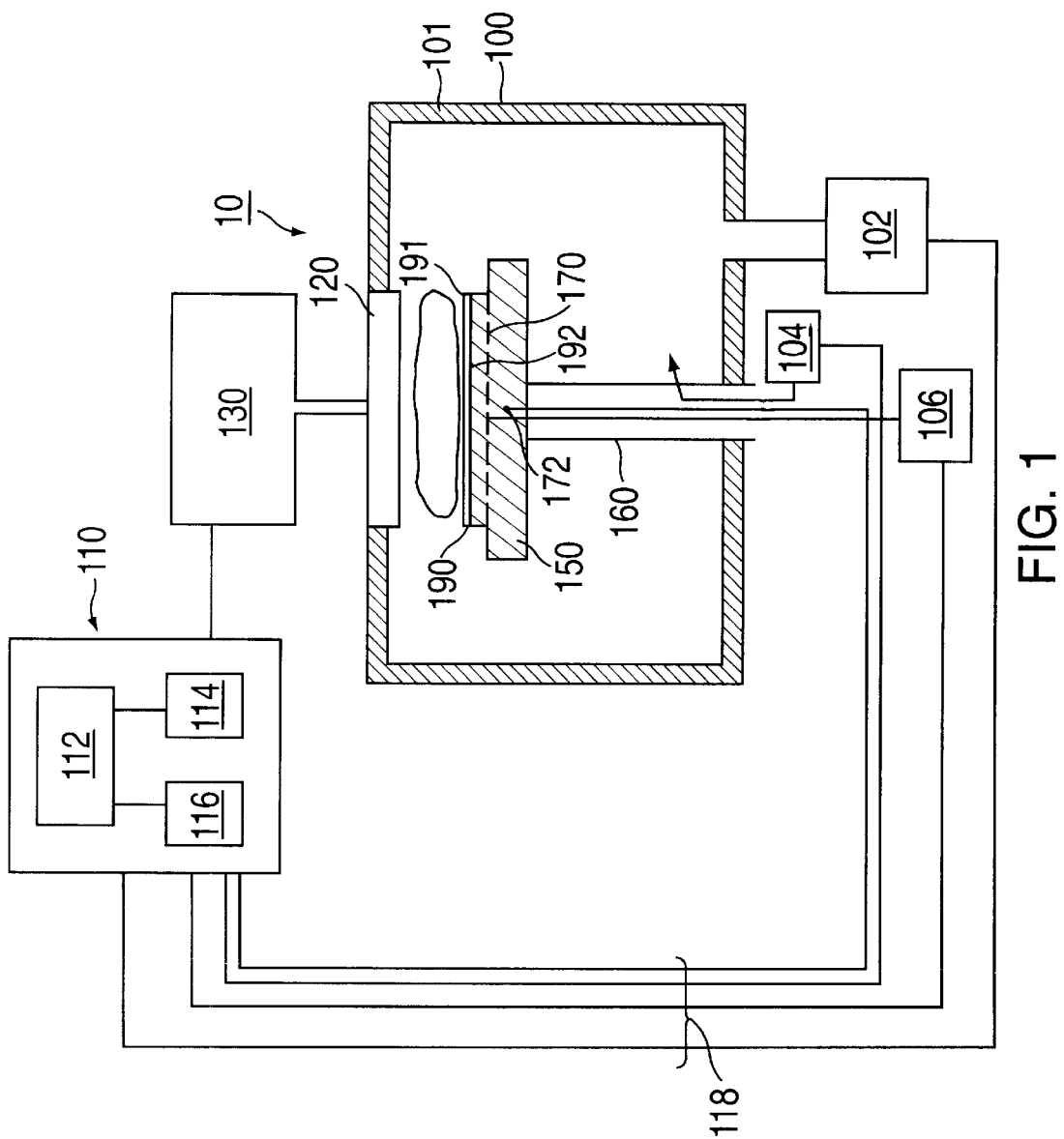
FIG. 1 depicts a schematic illustration of an apparatus that can be used for practicing embodiments of the invention.

FIG. 1 depicts schematically a wafer processing system 10 that can be used to practice embodiments of the present invention. The system 10 comprises a process chamber 100, a gas panel 130, a control unit 110, along with other hardware components such as a power supply 106 and a vacuum pump 102. One example of the process chamber 100 is a chemical vapor deposition (CVD) chamber, which has previously been described in a commonly-assigned U.S. patent application entitled "High Temperature Chemical Vapor Deposition Chamber," Ser. No. 09/211,998, filed on Dec. 14, 1998, and is herein incorporated by reference. Some key features of the system 10 are briefly described below.

Chamber 100

The process chamber 100 generally comprises a support pedestal 150, which is used to support a substrate such as a semiconductor wafer 190 within the process chamber 100. This pedestal 150 can typically be moved in a vertical direction inside the chamber 100 using a displacement mechanism (not shown). Depending on the specific process, the wafer substrate 190 has to be heated to some desired temperature prior to processing. In the illustrative chamber 100, the wafer support pedestal 150 is heated by an embedded heater 170. For example, the pedestal 150 may be resistively heated by applying an electric current from an AC supply 106 to the heater element 170. The wafer 190 is, in turn, heated by the pedestal 150, and can be maintained within a process temperature range of, for example, 450–750° C. A temperature sensor 172, such as a thermocouple, is also embedded in the wafer support pedestal 150 to monitor the temperature of the pedestal 150 in a conventional manner. For example, the measured temperature may be used in a feedback loop to control the power supply 106 for the heating element 170 such that the wafer temperature can be maintained or controlled at a desired temperature which is suitable for the particular process application.

Proper control and regulation of the gas flows through the gas panel 130 is performed by mass flow controllers (not shown) and a controller unit 110 such as a computer. A showerhead 120 allows process gases from the gas panel 130 to be uniformly distributed and introduced into the chamber 100. Illustratively, the control unit 110 comprises a central processing unit (CPU) 112, support circuitry 114 that contains memories for storing associated control software 116. This control unit 110 is responsible for automated control of the numerous steps required for wafer processing—such as wafer transport, gas flow control, temperature control, chamber evacuation, and so on. Bi-directional communications between the control unit 110 and the various components of the system 10 are handled through numerous signal cables collectively referred to as signal buses 118, some of which are illustrated in FIG. 1.

A vacuum pump 102 is used to evacuate the process chamber 100 and to maintain the proper gas flows and pressure inside the chamber 100. The showerhead 120, through which process gases are introduced into the chamber 100, is located above the wafer support pedestal 150. For some applications, the showerhead 120 is equipped with two separate pathways or gas lines, which allow two gases to be separately introduced into the chamber 100 without remixing. Details of the "dual-gas" showerhead 120 have been disclosed in a commonly-assigned U.S. patent application entitled "Dual Gas Faceplate for a Showerhead in a Semiconductor Wafer Processing System," Ser. No. 09/098,969, filed Jun. 16, 1998; and is herein incorporated by reference. This showerhead 120 is connected to a gas panel 130 which controls and supplies, through mass flow controllers (not shown), various gases used in different steps of the process sequence. During wafer processing, a purge gas supply 104 also provides a purge gas, for example, an inert gas, around the bottom of the pedestal 150 to minimize undesirable deposits from forming on the pedestal 150.

Silicide Formation

Figure 2A:
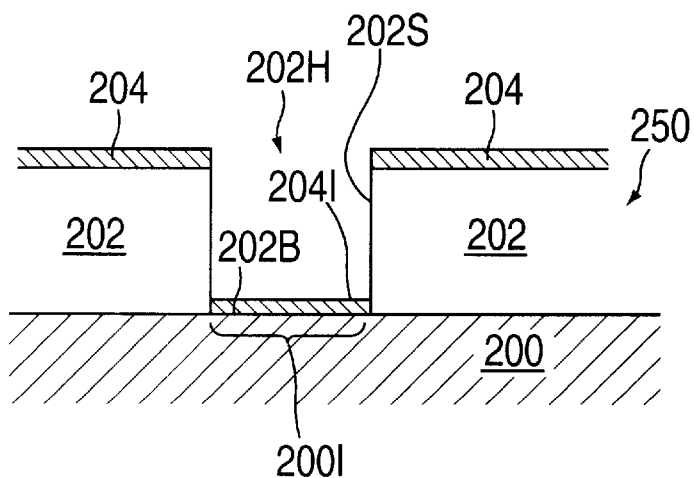
FIGS. 2a–c depict schematic cross-sectional views of a substrate structure at different stages of processing according to one embodiment of the invention.
Figure 2B:
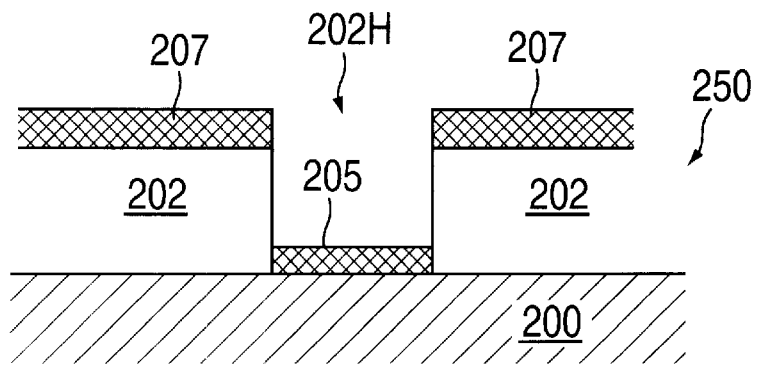
Figure 2C:
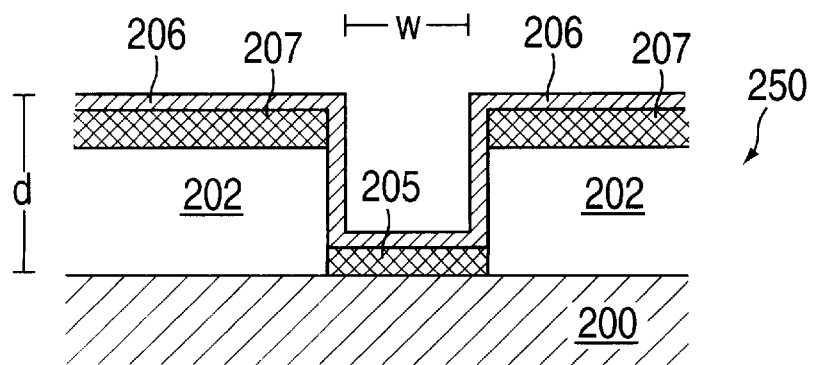

FIGS. 2a–c illustrate one embodiment of the present invention. In general, a substrate 200 refers to a workpiece upon which film processing is performed, and a substrate structure 250 is used to generally denote the substrate 200 together with other material layers formed upon the substrate 200. As used in the following discussions, the substrate 200 of FIGS. 2a–c refers generally to a silicon-containing layer or substrate including for example, a polysilicon layer (e.g., polysilicon gate electrode) or a silicon wafer.

FIG. 2a, for example, shows a cross-sectional view of a substrate structure 250, having a metal film 204 (the words "film" and "layer" are used interchangeably) upon a material layer 202 which has previously been formed upon a silicon substrate 200. In this particular illustration, the material layer 202 may be an insulating layer such as an oxide (e.g., $SiO_2$), which has been conventionally formed and patterned to provide a contact hole or opening 202H extending to an interface 200I of the substrate 200. The metal film 204 may generally be a refractory metal such as titanium (Ti), tantalum (Ta), or tungsten (W), among others. In one illustrative embodiment, the metal film 204 is a Ti film, which may be deposited upon the substrate structure 250 by a conventional Ti deposition process such as plasma enhanced chemical vapor deposition (PECVD) or physical vapor deposition (PVD). Typically, the Ti film 204 is deposited to a thickness in a range of about 25 to about 200Å, preferably between about 50 and about 100Å. In one embodiment, for example, the Ti film 204 has a thickness of about 100Å. However, the thickness may vary depending on the specific application, and may be less than about 100Å as device geometries decrease.

The deposited Ti film 204 also includes a portion 204I that contacts a portion of the substrate 200 at the interface 200I. As shown in FIG. 2a, due to the non-conformal nature of the deposited Ti film 204, a sidewall 202S of the contact hole 202H is not-covered by any Ti. The invention can also be practiced with a conformally-deposited Ti film 204. While the method of Ti film deposition is not critical to the practice of the present invention, the property of the Ti film 204, e.g., surface roughness, may affect the choice of process conditions used in subsequent process steps.

After the Ti film 204 is formed, a siliciding step is performed to convert the portion 204I of the Ti film 204 into $TiSi_x$. Specifically, and in a preferred embodiment of the invention, the Ti film 204, including the portion 204I at the interface 200I, is exposed to a gas environment comprising a Si-containing source or precursor gas, such as silane ($SiH_4$) or disilane ($Si_2H_6$), among others. The siliciding step can typically be performed in a deposition chamber such as that used for Ti or TiN deposition, with a silicon-containing precursor flow rate in a range of about 20 to about 3000 sccm, a total pressure between about 0.5 and about 20 Torr and a temperature between about 500 and about 750° C. An inert gas such as argon (Ar), nitrogen ($N_2$), helium (He), among others, may also be used, either singly or in combination, along with the silicon-containing precursor gas. For the precursor gas $SiH_4$, for example, the preferred parameters include a flow rate of less than about 3000 sccm, preferably between about 100 and about 2000 sccm, more preferably about 500 sccm; and a partial pressure between about 0.5 and about 20 Torr, preferably about 5 torr. The inert gas flow rate may vary according to the desired partial pressure for the silicon-containing precursor gas. A temperature between about 500 and about 750° C. may be used, preferably about 650° C. In general, although a higher temperature may result in a faster reaction rate, a lower process temperature may be desired due to thermal budget considerations.

Depending on the process temperature, the formation of $TiSi_x$ will occur in either one or two steps. For temperatures higher than about 600° C., a $TiSi_x$ layer 205 is formed in a single step from a reaction between the silicon-containing precursor gas and the portion 204I of the Ti layer 204, as shown in FIG. $2_b$. In this embodiment, as the silicon-containing precursor gas is introduced into the reaction chamber, a thermal reaction occurs between the Ti film 204 and the silicon-containing gas, resulting in the formation of $TiSi_x$. The process parameters are selected to enhance the reaction between the portion 204I of the Ti film 204 and the silicon-containing precursor gas, while minimizing possible reaction between the Ti film 204I and the underlying silicon-containing layer or substrate 200. For example, a gas environment comprising a higher percentage or partial pressure of the silicon-containing precursor gas, or a lower substrate temperature, tends to favor a reaction between the Ti film 204 and the silicon-containing gas. As such, the $TiSi_x$ layer 205 comprises silicon arising primarily from the silicon-containing precursor gas.

The thickness of the resulting $TiSi_x$ layer 205 is usually about two and a half times that of the Ti layer 204I. Of course, $TiSi_x$ is also formed upon other parts of the Ti film 204, as illustrated by the $TiSi_x$ layer 207, that lies atop the insulating layer 202. However, this invention concerns the formation of a silicide layer in contact with a silicon-based material (e.g., Si substrate 200) that may otherwise degrade under a siliciding step using prior art approaches. According to the method of the present invention, the amount of Si introduced by the Si-containing precursor gas to the Ti portion 204I at the interface 200I should be sufficient to completely convert the Ti portion 204I into $TiSi_x$. Even though the Ti film 204 disposed on the insulating layer 202 is shown as completely converted to a $TiSi_x$ layer 207 in FIG. $2_b$, it is not required in practicing the embodiments of the invention. The $TiSi_x$ layer 205 thus formed possesses the desired physical and electrical characteristics for use as an intermediate layer in a multi-layer metallization stack. As such, the $TiSi_x$ layer 205 is formed without depleting silicon from the underlying substrate 200.

In another embodiment, the intermediate $TiSi_x$ layer 205 may be formed using a plasma process. For example, a plasma may be generated from the silicon-containing precursor gas, optionally with one or more inert gases. The plasma may be generated from a variety of power sources, including for example, radio-frequency (RF), microwave, electron cyclotron resonance (ECR) or remote plasma sources, among others, using various commercially available plasma processing chambers. In this embodiment, the process temperature may be in a range of between about 300 and about 500° C., with a total pressure between about 0.5 and about 20 Torr. A flow rate of the silicon-containing precursor gas of less than about 3000 sccm, preferably between about 100 and about 2000 scam, and more preferably about 100 scam, may be used. Since the plasma process may be performed at a temperature lower than that used in a thermal reaction, it is expected that the reaction between the Ti film 204 and the underlying silicon substrate 200 can be readily suppressed.

After the formation of the intermediate $TiSi_x$ layer 205, processing may continue with the deposition of a barrier layer, e.g., a conductive layer such as a refractory metal nitride film 206, as illustrated in FIG. 2c. A titanium nitride (TiN) film 206, for example, may be formed by CVD using a reaction between titanium tetrachloride ($TiCl_4$) and ammonia ($NH_3$) in the chamber 100 of FIG. 1. Illustratively, inert gases such as helium (He) and nitrogen ($N_2$) are introduced into the chamber 100, along with $TiCl_4$, via one pathway (gas line) of the showerhead 120. $NH_3$, along with $N_2$, is introduced into the chamber 100 via the second pathway of the showerhead 120. A bottom inert gas purge flow (e.g., Ar) of about 2000 sccm is also established through a separate gas line and gas supply 104 provided at the bottom of the chamber 100. Typically, the reaction can be performed at a $TiCl_4$ vapor flow rate of between about 5 and about 40 scam with an inert gas flow of between about 500 and about 5000 scam, $NH_3$ flow rate of between about 50 and about 500 scam with a $N_2$ flow of between about 500 and about 5000 sccm. A total pressure between about 3 and about 30 torr and a pedestal temperature of greater than about 450° C. (e.g., between about 600and about 700° C.), may be used. Under these process conditions, the TiN film 206 exhibits a step coverage of at least 95% for an opening having an aspect ratio of about 3.5:1 (aspect ratio is defined as the ratio between the depth d and the width w of the opening 202H upon which TiN deposition takes place.)

In general, if other refractory metal silicide (e.g., $TaSi_x$ or $WSi_x$) is used as the intermediate silicide layer 205, then the barrier layer 206 is preferably the corresponding refractory metal nitride such as tantalum nitride or tungsten nitride. An additional metal layer such as aluminum or tungsten may be formed in subsequent metal deposition steps (not shown) of the IC fabrication sequence to provide a metal connection to the silicon substrate 200 in the contact opening 202H, using techniques known in the art.

As previously mentioned, depending on the process temperature, silicide formation may also be accomplished in a two-step procedure—e.g., if the silicon-containing precursor gas is introduced at a substrate temperature below about 600° C. This embodiment is illustrated in FIGS. 3a–c.

Figure 3A:
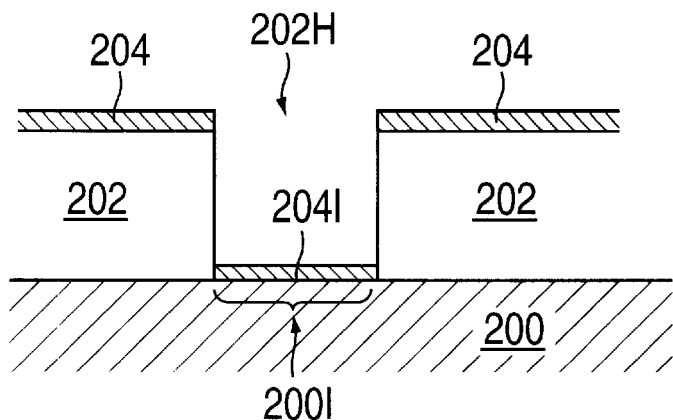
FIGS. 3a–c depict schematic cross-sectional views of a substrate structure at different stages of processing according to another embodiment of the invention.
Figure 3B:
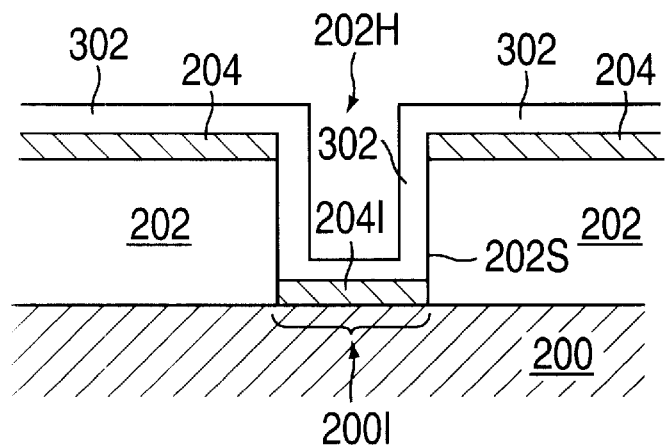
Figure 3C:
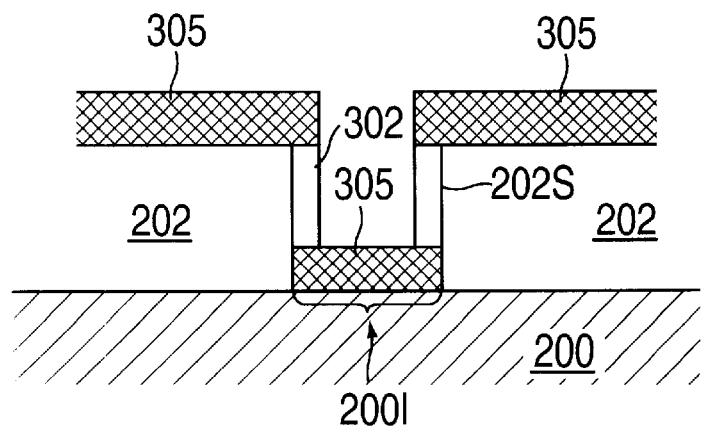

FIG. 3a depicts the same substrate structure as that illustrated in FIG. 2a, in which the Ti film 204 is formed after a contact hole 202H has been defined in an insulating layer 202. The portion 204I of the Ti film 204 contacts the silicon substrate 200 at the interface 200I. According to this embodiment, a Si layer 302 is then formed over the structure of FIG. 3a by chemical vapor deposition using a Si-containing precursor. For example, using thermal decomposition of a Si-containing gas (e.g., $SiH_4$ at about 500° C.), a conformal Si layer 302 can be deposited over the Ti film 204, including the portion 204I, as well as along the sidewall 202S of the contact hole 202H, as shown in FIG. 3b.

The Si layer 302 may be deposited from a $SiH_4$ flow rate of less than about 3000 sccm, preferably between about 100 and about 2000 sccm, and more preferably about 500 sccm. A $SiH_4$ partial pressure of between about 0.5 and about 20 torr, preferably about 5 torr, may be used. One or more inert gases (e.g., Ar, $N_2$ or He, among others) may also be used along with the $SiH_4$ gas. The Si layer 302 is usually deposited to a thickness of about two times the thickness of the Ti film portion 204I. For example, for a Ti film thickness of between about 25 and about 200Å, the Si layer 302 is typically deposited to a thickness between about 50 and about 400Å. This Si:Ti thickness ratio of about 2:1 tends to ensure a complete conversion of the Ti film portion 204I to TiSi$_x$ in a subsequent reaction.

In practicing the invention, it is preferable that the Si layer 302 be amorphous, in order to enhance its subsequent reaction with the Ti film portion 204I, while minimizing the reaction between the Ti film portion 204I with the underlying Si substrate 200. As such, the process parameters for silicon deposition from the silicon-containing precursor gas are preferably selected to favor the formation of amorphous Si. For example, using a SiH$_4$ precursor gas, a temperature between about 300 and about 600° C. may be used to deposit an amorphous Si layer 302, using process parameters that are known in the art. If Si$_2$H$_6$ is used as the silicon-containing precursor gas, a temperature between about 200 and about 400° C. may be used. Alternatively, the Si layer 302 may also be deposited from plasma reactions using appropriate silicon-containing precursor gases and process parameters that are known in the art. Again, different plasma sources such as RF, remote plasma, ECR, among others, may be used in practicing this embodiment.

A subsequent step, illustrated in FIG. 3c, is performed to initiate a reaction between the Si layer 302 and the Ti film 204, resulting in the formation of a TiSi$_x$ layer 305. For example, this reaction step can be performed by heating the substrate structure of FIG. 3b to a temperature of at least about 600° C. According to the present invention, it is preferable that the entire portion 204I of the Ti film 204 be converted into a TiSi$_x$ layer 305 contacting the interface 200I of the underlying silicon substrate 200. Depending on the specific Ti deposition process and the thickness of the Ti film 204, there may or may not be a complete conversion from Ti to TiSi$_x$ on other portions of the Ti film 204—e.g., those contacting the 202 layer outside of the contact hole 202H. As previously mentioned, the present invention concerns a method of forming a silicide layer in contact with a Si-containing layer. As such, process parameters are adjusted in this two-step procedure to ensure a complete conversion of those portions of the Ti film 204 contacting a Si-containing layer, such as the portion 204I. As previously mentioned, the Si layer 302 is preferably amorphous, such that the reaction rate between the Si layer 302 and the Ti film portion 204I will be higher compared to that between the Ti film portion 204I and the Si substrate 200. If the Si substrate 200 comprises polysilicon (instead of single crystal silicon), it is also expected that the Ti film portion 204I react preferentially with the Si layer 302. As such, the silicide layer 305 can be formed without depleting Si from the underlying Si substrate 200, thus avoiding substantial degradation of the Si substrate 200.

Subsequent processing may continue with the formation of a conductive layer (not shown)—e.g., a barrier layer such as TiN, on the TiSi$_x$ layer 305, using a process previously described in connection with FIG. 2c. Additional metallization steps may then be performed to provide a metal connection to the Si substrate 200 in the contact opening 202H. As shown in FIG. 3c, a portion of the Si layer 302 remains unreacted on the sidewall 202S of the contact opening 202H, but it will not significantly affect the performance of the metal connection.

FIGS. 4a–h depict an alternative embodiment of the invention, in which TiSi$_x$ (or generally, metal silicides such as refractory metal silicides) is formed by a reaction between a chemisorbed Ti-containing species and a Si-containing precursor. In this embodiment, after patterning the insulating layer 202 to form the contact hole 202H extending to the silicon substrate 200, a Ti-containing species is chemisorbed or adsorbed onto the substrate structure, including surfaces of the insulating layer 202, along the sidewall 202S and at the bottom 202B of the contact hole 202H, and the silicon substrate 200. This may be achieved, for example, by exposing the substrate structure to a Ti-containing precursor, such as TiCl$_4$. For example, a TiCl$_4$ flow rate between about 50 and about 1000 mg/min., preferably about 50 mg/min., and a pressure of between about 0.5 and about 20 Torr, preferably about 5 Torr, may be used. An inert gas such as nitrogen, argon and helium, among others, is usually used as a carrier gas to introduce TiCl$_4$ into the chamber. The temperature of the silicon substrate 200 is preferably maintained at about 450° C., but a range of between about 400 and about 700° C. is also acceptable.

The substrate structure is exposed to the TiCl$_4$ flow for at least a sufficiently long time to allow the surface of the silicon substrate 200 to be saturated with a monolayer of a Ti-containing species, such as TiCl$_4$ or more generally, a distribution of TiCl$_y$ species, where y may be equal to 0 through 4. Species such as TiCl, TiCl$_2$ or TiCl$_3$ are also referred to as sub-chlorides. If desired, a reactant gas such as hydrogen (H$_2$), which can extract or react with chlorine (Cl), may also be introduced, along with TiCl$_4$, to the substrate to enhance the adsorption of titanium sub-chlorides. The H$_2$ flow rate is maintained between about 500 and about 5000 sccm, preferably about 1000 sccm. The formation of sub-chlorides is also favored by using a higher substrate temperature. Thus, a thin chemisorbed layer 402 comprising TiCl$_y$ is formed to substantially cover the exposed portion (interface 202I) of the silicon substrate 200, as shown in FIG. 4a.

A purge step (not shown) is then performed using Ar at a flow rate of about 3000 sccm and a pressure of about 5 Torr. The purging is performed for a sufficiently long time, e.g., about 10 seconds, to eliminate residual gas phase Ti-containing precursor (i.e., TiCl$_4$ that is not chemisorbed on any surface) from the chamber. Other inert gases such as He or N$_2$, among others, are also appropriate. In general, a flow rate between about 1000 and about 10000 sccm and a pressure between about 2 and about 20 Torr may be used. Depending on the specific chamber volume and condition, the purge time may vary. It is desirable to select a purge gas flow rate that is sufficiently high to achieve adequate purging in a relatively short period of time. In one embodiment, a purging time of about 10 seconds is used.

Figure 4B:
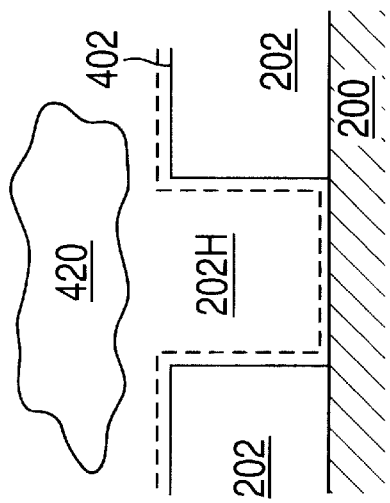
FIGS. 4a–h depict schematic cross-sectional views of a substrate structure at different stages of processing according to another embodiment of the invention.
Figure 4D:
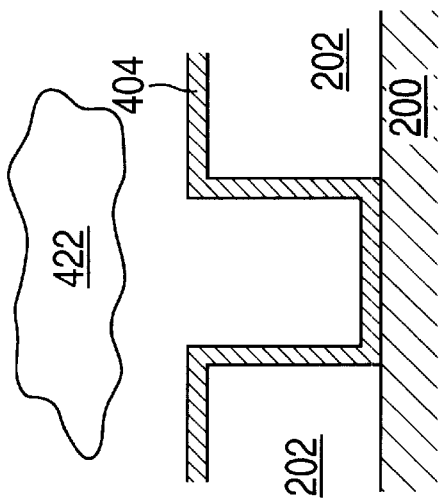
Figure 4A:
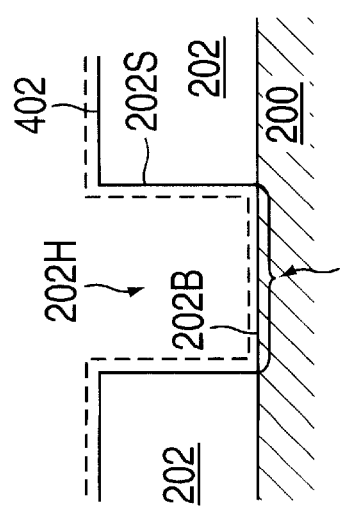
Figure 4C:
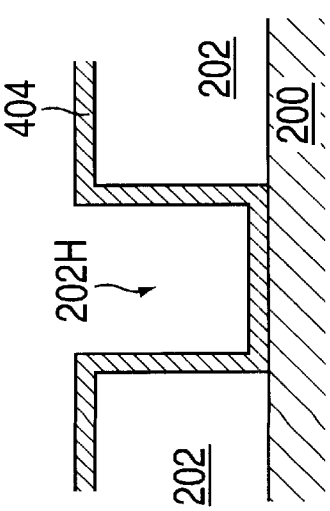

After the purging step, the substrate structure 450 with the chemisorbed layer 402 of TiCl$_y$ is exposed to a Si-containing environment 420, as shown in FIG. 4b. The Si-containing environment 420 comprises a Si-containing precursor such as SiH$_4$, Si$_2$H$_6$, dichlorosilane (SiCl$_2$H$_2$) among others. For example, a SiH$_4$ flow rate between about 100 and about 5000 scam may be used, preferably about 100 scam, at a pressure between about 0.5 and about 20 torr, preferably about 5 torr. In addition, one or more inert gases may be present along with the Si-containing precursor in the Si-containing environment 410. At a temperature of about 450° C., or in a range between about 400 and about 700° C., a reaction between the chemisorbed layer 410 of TiCl$_y$ and SiH$_4$ occurs, and results in the formation of a conformal TiSi$_x$ layer 404 on the insulating layer 202, the contact hole 202H, and the Si substrate 200, as shown in FIG. 4c. This conformal TiSi$_x$ layer 404 is typically a thin layer, whose thickness is limited by the thickness of the adsorbed TiCl$_x$ layer 402. For the Si-containing environment 420, the Si-containing precursor flow should be sufficient to saturate the substrate surface, or at least to allow a complete reaction with the portion of the TiCl$_x$ layer 402 that is formed over the interface 200I of the silicon substrate 200. At a temperature of about 450° C., the reaction proceeds at a rate of less than about 1 Angstrom per cycle (Å/cycle), e.g., about 0.4 Å/cycle. By properly controlling the process parameters, e.g., $SiH_4$ pressure, flow rate and temperature, the $TiSi_x$ layer 404 may be formed in contact with the interface 200I of the Si substrate 200, without substantial depletion of Si from the substrate 200. Typically, a higher partial pressure or flow rate of the Si-containing precursor and a lower temperature tends to favor a reaction between the adsorbed $TiCl_y$ with Si-containing precursor, as opposed to a reaction with the Si substrate 200. Alternatively, an activated Si-containing precursor, such as that generated by the use of a relatively low power plasma, may also be used.

After the formation of the $TiSi_x$ layer 404, a purge step (not shown in FIG. 4) is again performed to remove any residual Si-containing precursor from the chamber. The purge gas flow rate and pressure conditions are similar to those used for purging the Ti-containing precursor.

In order to obtain a composite $TiSi_x$ layer of desired thickness, the steps of $TiCl_y$ chemisorption, chamber purging, $SiH_4$ gas exposure, and chamber purging may be repeated for as many times as necessary. For example, by repeating the cycle between about 200 and about 500 times, a composite $TiSi_x$ layer suitable for contact applications may be formed.

In another aspect of the invention, a catalyst may also be introduced during the process sequence to achieve certain desired film properties. For example, after the introduction of a first precursor $TiCl_4$ to form the adsorbed $TiCl_y$ layer, a catalyst such as a Zn-containing precursor may be introduced into the chamber. The Zn-containing precursor may be used to scavenge chlorine (Cl) from the adsorbed $TiCl_y$ layer, thus enhancing the formation of sub-chlorides. After the chamber has been purged of the catalayst, the second precursor, such as $SiH_4$, may be introduced to react with the sub-chlorides to form the silicided layer, as previously described. Since $SiH_4$ tends to-react more readily with the sub-chlorides than with $TiCl_4$, the Zn-containing catalyst may allow a lower substrate temperature to be used for $TiSi_x$ formation, thus favoring a reaction with $SiH_4$, as opposed to the Si substrate 200.

In yet another aspect of the invention, other compounds comprising Ti and Si, aside from $TiSi_x$, may also be used to form the silicided contact. For example, a ternary compound containing Ti, Si and nitrogen (N) may be formed by adding a N-containing precursor to the process sequence described above. In one embodiment, a Ti-containing species may be adsorbed onto the substrate surface, as previously described for FIG. 4a. The chamber is then purged, and a second precursor, e.g., Si-containing species, is introduced into the chamber, similar to that shown in FIG. 4b. Reaction between the adsorbed Ti-containing layer and the Si-containing species results in the formation of a $TiSi_x$ layer 404, or more generally, a layer of reaction product species, similar to that shown in FIG. 4c.

Figure 4E:
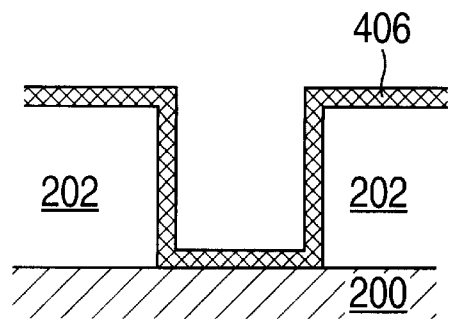

After purging the chamber, a third precursor, e.g., a nitrogen (N)-containing species, is introduced into the chamber. FIG. 4d shows the $TiSi_x$ layer 404 being exposed to the N-containing environment 422, which may also contain other gases such as an inert gas, aside from the N-containing species. As illustrated in FIG. 4e, a reaction between the $TiSi_x$ layer 404 and the N-containing species results in the formation of a layer 406 comprising a ternary compound such as $TiSi_xN_z$. Although each element in the ternary compound may be introduced by a separate precursor, it is also possible in certain cases that a single precursor may supply more than one element for the formation of the desired compound.

In general, the various precursor species may be introduced in different orders within the process sequence. Typically, the order in which precursors are introduced in the process or reaction sequence is selected to optimize the desired reaction product, by considering factors such as the adsorption characteristics or reaction rates of the precursors or intermediate species formed during the reaction sequence.

Figure 4F:
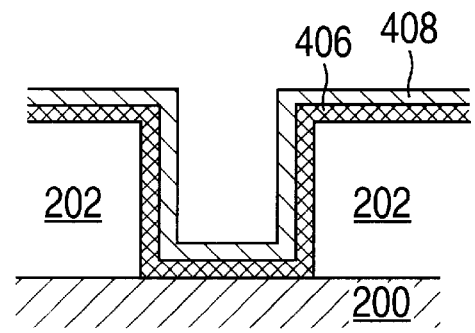

After the formation of the $TiSi_x$ layer 404, or more generally, a metal silicide layer 406 (which may be a layer comprising a non-binary compound as shown in FIG. 4e), subsequent process steps can be performed to complete the formation of a multi-layer metallization stack. FIG. 4f, for example, shows the formation of a conductive layer 408 upon the metal silicide layer 406. Depending on the specific application, the conductive layer 408 may be a nitride layer, e.g., TiN, or other refractory metal nitrides with suitable barrier properties. For example, the TiN layer 408 may be formed by thermal or plasma CVD using a reaction between titanium tetrachloride ($TiCl_4$) and ammonia ($NH_3$) using process parameters that are known in the art.

Alternatively, the conductive layer 408 may also be formed from appropriate precursors using process steps similar to those previously described in connection with FIGS. 4a–4e. For example, if the conductive layer 408 is TiN, $TiCl_x$ can be adsorbed or chemisorbed onto the metal silicide layer 406, by providing $TiCl_4$ at process parameters similar to those disclosed above. After purging the excess $TiCl_4$ from the chamber, the adsorbed or chemisorbed $TiCl_x$ is allowed to react with $NH_3$, which is introduced at a flow rate between about 100 and about 3000 sccm, preferably about 500 sccm. This results in the formation of a thin TiN layer with excellent step coverage inside the opening 202H. Additional cycles (of adsorption and reaction, with appropriate purging) may also be performed to provide a thicker, composite TiN layer, if desired. Alternatively, the TiN layer 408 may also be formed by a combination of the adsorption reaction approach, along with CVD TiN.

In other embodiments, the conductive layer 408 may also be a combination layer, such as a liner/barrier layer comprising for example, a refractory metal and a metal nitride, such as Ti, TiN, tantalum (Ta), tantalum nitride (TaN), among others.

Figure 4G:
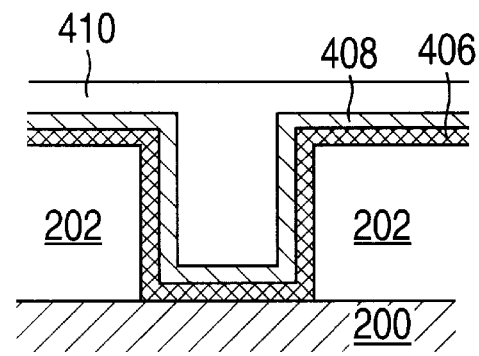
Figure 4H:
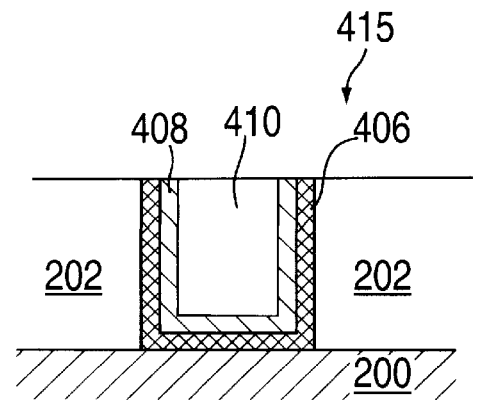

Subsequently, a metal layer 410 is formed upon the conductive layer 408, as shown in FIG. 4g. The metal layer 410, for example, may comprise tungsten (W) or aluminum (Al). Illustratively, a CVD reaction between tungsten hexafluoride ($WF_6$) and hydrogen ($H_2$) may be used to form the tungsten metal layer 410 with process parameters that are known in the art. In a subsequent step, portions of the metal layer 410, the conductive nitride layer 408 and the metal silicide layer 406 lying outside the contact hole 202H are removed by a planarization technique such as chemical mechanical polishing (CMP), resulting in a metal plug structure 415, as shown in FIG. 4h. It should be noted that the specific metallization process steps or sequence disclosed herein are meant for illustrative purposes. Other process sequence employing different material layers or processing techniques may also be used in conjunction with the silicide formation according to embodiments of the present invention.

Figure 5:
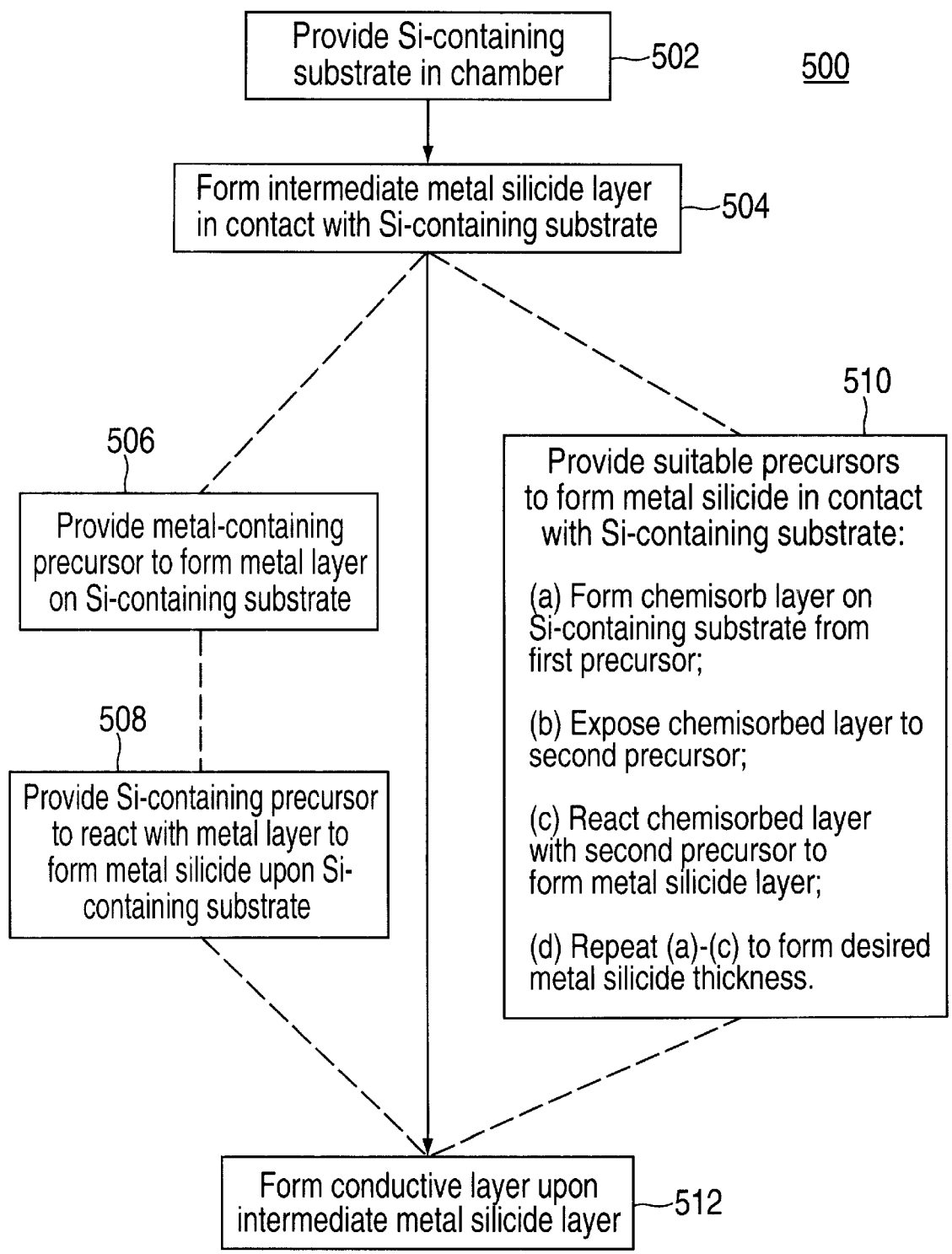
FIG. 5 depicts a process sequence incorporating the silicide formation steps according to embodiments of the invention.

FIG. 5 illustrates a process sequence 500 incorporating various steps of the invention for the formation of a non-substrate degrading intermediate silicide layer. These processing steps may be performed inside a typical CVD or PVD chamber, similar to those used for Ti or TiN deposition. As shown in step 502, a Si-containing substrate (or a Si-based layer) is provided inside the process chamber. Depending on the specific stage of IC processing, the Si-containing substrate may or may not have a material layer already disposed upon it. Such a material layer may, for example, be an oxide layer with a contact hole extending to an interface of the Si-based substrate (thus, exposing that portion of the Si-based substrate). The present invention is directed towards the formation of a silicide layer that contacts the Si-containing substrate.

In step 504, an intermediate silicide layer, e.g., a metal silicide layer, is formed in contact with the Si-containing substrate. According to embodiments of the invention, this silicide formation may be accomplished by different approaches using various precursors.

One approach follows step 506, in which a conductive layer is first formed upon the Si-containing substrate. For example, this conductive layer may be a metal layer such as Ti or other refractory metals formed from a suitable metal-containing precursor. In step 508, a Si-containing source or precursor is provided to react with the deposited metal of step 506 to form an intermediate silicide layer. This intermediate layer is, for example, a TiSi$_x$ layer formed by a technique selected from one of the following: exposure of the Ti layer to a Si ambient atmosphere (e.g., SiH$_4$ or Si$_2$H$_6$); or as a solid-solid reaction between the deposited Ti layer and a Si layer (e.g., amorphous or polysilicon) deposited from a Si-containing precursor such as SiH$_4$ or Si$_2$H$_6$. Alternatively, other suitable precursors may be used to form the intermediate metal silicide layer such as tantalum silicide, tungsten silicide, among others.

Alternatively, as shown in step 510, the intermediate metal silicide layer of step 504 may be formed from a reaction (e.g., thermal or plasma enhanced) between suitable precursors—e.g., metal halides and silicon-containing gases. In the case of a TiSi$_x$ layer, precursors such as TiCl$_4$ and SiH$_4$ may be used. According to one embodiment of the invention, a first precursor is adsorbed as a thin layer or a monolayer onto the Si-containing substrate. The adsorbed first layer is then exposed to a second precursor to form a silicide layer. Optionally, the formation of the silicide layer may be modified by introducing a catalyst to facilitate the desired reaction, or by adding a third precursor for further reaction (not shown in FIG. 5).

According to embodiments of the invention, conditions for the various silicide formation processes are selected such that the metal silicide layer is formed primarily from a reaction involving a Si-containing source or precursor that is different from the Si-containing substrate. As such, the metal silicide layer is formed with silicon originating essentially from the Si-containing source, with minimal or negligible depletion of Si from the underlying substrate.

In step 512, a conductive layer is formed upon the intermediate metal silicide layer formed in step 504, by providing suitable precursors to the substrate inside the chamber. This conductive layer may, illustratively, be a metal nitride (e.g., TiN) used as a barrier layer, or a combination liner/barrier layer in a metallization stack. Thereafter, additional processing steps (not shown) may be performed to deposit another suitable conductive metal (e.g., W or Al) upon the conductive barrier layer to allow subsequent formation of conductive paths or interconnects for the semiconductor devices.

Thus, by providing an external Si-containing source, embodiments of the invention allow the formation of a silicide layer in contact with a Si-containing substrate, without undesirable consumption of the underlying Si-containing substrate material. As such, the invention provides a method of silicidation in semiconductor devices with improved reliability and performance characteristics.

Although various preferred embodiments, which incorporate the teachings of the present invention, have been shown and described in detail, those skilled in the art can readily devise many other varied embodiments that still incorporate these teachings.

What is claimed is:

1. A method of forming a silicide layer in contact with a silicon substrate, comprising the steps of:

(a) forming a metal-containing layer in contact with the silicon substrate;

(b) exposing the metal-containing layer to a gaseous precursor comprising a catalyst for forming a metal silicide, wherein the catalyst scavenges chlorine from the metal-containing layer;

(c) exposing the metal-containing layer to a silicon-containing source that is different from the silicon substrate; and (d) forming the metal silicide layer by reacting the metal-containing layer with the silicon-containing source; wherein the metal silicide layer is formed from silicon originating primarily from the silicon-containing source.

2. The method of claim 1, wherein the metal-containing layer of the step (a) is an adsorbed layer formed by exposing the silicon substrate to a metal-containing precursor.

3. The method of claim 2, further comprising:

performing steps (a) through (d) in a chamber; and between the steps (a) and (c), purging the chamber.

4. The method of claim 3, wherein the metal-containing precursor is TiCl$_4$.

5. The method of claim 3, wherein the silicon-containing source of the step (c) is selected from the group comprising silane, disilane and dichlorosilane.

6. The method of claim 3, further comprising the steps of:

(e) after step (d), purging the chamber;

(f) forming another adsorbed metal-containing layer by exposing the previously formed metal silicide layer to the metal-containing precursor inside the chamber;

(g) exposing the metal-containing layer to a gaseous precursor comprising a catalyst for forming a metal silicide layer, wherein the catalyst scavenges chlorine from the metal-containing layer;

(h) after the step (g), purging the chamber;

(i) forming another metal silicide layer on the previously formed metal silicide layer by exposing the another adsorbed metal-containing layer to a silicon-containing environment; and j) repeating the steps (e) through (i) for additional cycles to form a composite metal silicide layer having a desired total thickness.

7. The method of claim 3, further comprising the step of:

between steps (a) and (b), purging the chamber.

8. The method of claim 3, further comprising the steps of:

(e) after the step (d), purging the chamber;

(f) forming a layer comprising a ternary metal silicide by exposing the metal silicide layer of the step (d) to a nitrogen-containing environment.

9. The method of claim 4, wherein the adsorbed layer is formed at a flow rate of $TiCl_4$ of between about 50 and about 1000 mg/minute.

10. The method of claim 4, wherein the step (d) is performed with the silicon-containing source at a flow rate less than about 5000 sccm.

11. The method of claim 4, wherein the step (d) is performed at a partial pressure of the silicon-containing source between about 0.5 and about 20 torr.

12. The method of claim 4, wherein the step (d) is performed at a temperature between about 400 and about 700° C.

13. The method of claim 2, further comprising the step of:

(e) forming a conductive layer upon the metal silicide layer, wherein the conductive layer is a metal nitride.

14. The method of claim 1, wherein the metal-containing layer is a metal layer.

15. The method of claim 14, wherein the metal layer is a refractory metal selected from the group consisting of titanium, tantalum and tungsten.

* * * * *